(12) United States Patent
Wang et al.

(10) Patent No.: US 10,621,904 B2
(45) Date of Patent: Apr. 14, 2020

(54) PIXEL CIRCUIT AND METHOD FOR DRIVING THE SAME, DISPLAY PANEL AND DISPLAY DEVICE

(71) Applicants: BOE Technology Group Co., Ltd., Beijing (CN); Hefei BOE Optoelectronics Technology Co., Ltd., Hefei, Anhui (CN)

(72) Inventors: Zhangmeng Wang, Beijing (CN); Xianjie Shao, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/185,349

(22) Filed: Nov. 9, 2018

(65) Prior Publication Data

US 2019/0206301 A1 Jul. 4, 2019

(30) Foreign Application Priority Data

Jan. 4, 2018 (CN) .......................... 2018 1 0008425

(51) Int. Cl.
*G09G 5/10* (2006.01)
*G09G 3/20* (2006.01)
*H03K 19/20* (2006.01)
*G09G 3/36* (2006.01)

(52) U.S. Cl.
CPC ......... *G09G 3/2018* (2013.01); *G09G 3/3648* (2013.01); *H03K 19/20* (2013.01); *G09G 2300/0426* (2013.01); *G09G 2310/027* (2013.01)

(58) Field of Classification Search
CPC ... G09G 2300/0426; G09G 2300/0857; G09G 2310/027; G09G 3/2018; G09G 3/3648; G09G 3/3696; H03K 19/20
See application file for complete search history.

(56) References Cited

U.S. PATENT DOCUMENTS

| 2009/0153546 | A1* | 6/2009 | Senda | G09G 3/3283 |
| | | | | 345/214 |
| 2011/0141098 | A1* | 6/2011 | Yaguma | G09G 3/3688 |
| | | | | 345/212 |

* cited by examiner

*Primary Examiner* — Insa Sadio
(74) *Attorney, Agent, or Firm* — Nath, Goldberg & Meyer; Joshua B. Goldberg

(57) ABSTRACT

A display circuit includes a switch component configured to output a data voltage signal to the latch component under control of a scanning signal; a latch component configured to output a first control signal under control of a reset signal in a case where the switch component is turned off, and output the first control signal or a second control signal to the charging component according to the data voltage signal in a case where the switch component is turned on; and a charging component configured to write a first signal to a display component in the case where the switch component is turned off, and in the case where the switch component is turned on, write the first signal to the display component under control of the first control signal and write a second signal to the display component under control of the second control signal.

11 Claims, 5 Drawing Sheets

PIXEL CIRCUIT AND METHOD FOR DRIVING THE SAME, DISPLAY PANEL AND DISPLAY DEVICE

CROSS-REFERENCE TO RELATED APPLICATIONS

The present application claims the priority of Chinese Patent Application No. 201810008425.5, entitled "PIXEL CIRCUIT AND METHOD FOR DRIVING THE SAME, DISPLAY PANEL AND DISPLAY DEVICE", filed on Jan. 4, 2018, the contents of which are incorporated herein in their entirety by reference.

TECHNICAL FIELD

The present disclosure relates to, but not limited to, the field of display technology, and in particular, to a pixel circuit and a method for driving a pixel circuit, a display panel and a display device.

BACKGROUND

With development of liquid crystal display technology, liquid crystal display panels used for wearable devices are gradually emerging. The liquid crystal display panel of the wearable device has a small size, and is manufactured by a method different from that for manufacturing a conventional liquid crystal display panel. The conventional liquid crystal display panel has a pixel structure in which a pixel electrode is charged by a data line, thus hundreds of gray scales may be realized according to different voltages of the data line. By contrast, the liquid crystal display panel of the wearable device has a pixel structure including a digital circuit, only two gray scales, i.e., a first gray scale and a second gray scale, can be realized according to high and low levels of a digital signal.

The liquid crystal display panel of the wearable device is generally manufactured by a low temperature polycrystalline silicon thin film transistor process, a latch is formed by a logic gate circuit, and a voltage of the pixel electrode is maintained. A common method for maintaining the voltage of the pixel electrode is to employ a buffer, i.e., two inverters with end to end connection, in such way, when an input of data signal is turned off, an output signal is circulated in the buffer, thus is maintained.

SUMMARY

An embodiment of the present disclosure provides a pixel circuit, including a switch component, a latch component and a charging component, the switch component is configured to output a data voltage signal to the latch component under control of a scanning signal, the latch component is configured to output a first control signal under control of a reset signal in a case where the switch component is turned off, so that the charging component is turned on, and output the first control signal or a second control signal to the charging component according to the data voltage signal in a case where the switch component is turned on, the charging component is configured to write a first signal to a display component in the case where the switch component is turned off, so as to reset the display component, and in the case where the switch component is turned on, write the first signal to the display component under control of the first control signal so as to control the display component to display a first gray scale, and write a second signal to the display component under control of the second control signal so as to control the display component to display a second gray scale.

In some implementations, the switch component includes a first transistor having a first switching characteristic, a first electrode of the first transistor is coupled to a data line, a second electrode of the first transistor is coupled to the latch component, and a control electrode of the first transistor is coupled to a scan line.

In some implementations, the latch component includes a first NOR gate and a second NOR gate, a first input terminal of the first NOR gate is coupled to the switch component, a second input terminal of the first NOR gate is coupled to an output terminal of the second NOR gate and the charging component, an output terminal of the first NOR gate is coupled to a first input terminal of the second NOR gate and the charging component, the first input terminal of the second NOR gate is coupled to the output terminal of the first NOR gate and the charging component, a second input terminal of the second NOR gate is coupled to a reset signal terminal, and the output terminal of the second NOR gate is coupled to the second input terminal of the first NOR gate and the charging component.

In some implementations, the first NOR gate includes a second transistor and a third transistor which have a second switching characteristic and a fourth transistor and a fifth transistor which have the first switching characteristic, control electrodes of the second transistor and the fourth transistor are used as the first input terminal of the first NOR gate, control electrodes of the third transistor and the fifth transistor are used as the second input terminal of the first NOR gate, a first electrode of the third transistor and second electrodes of the fourth transistor and the fifth transistor are used as the output terminal of the first NOR gate, a first electrode of the second transistor is coupled to a second electrode of the third transistor, a second electrode of the second transistor is coupled to a first power supply line, the control electrode of the second transistor is coupled to the switch component and the control electrode of the fourth transistor, the first electrode of the third transistor is coupled to the second electrodes of the fourth transistor and the fifth transistor, the second electrode of the third transistor is coupled to the first electrode of the second transistor, the control electrode of the third transistor is coupled to the control electrode of the fifth transistor and the output terminal of the second NOR gate, a first electrode of the fourth transistor is coupled to a first electrode of the fifth transistor and a second power supply line, the second electrode of the fourth transistor is coupled to the first electrode of the third transistor and the second electrode of the fifth transistor, the control electrode of the fourth transistor is coupled to the switch component and the control electrode of the second transistor, the first electrode of the fifth transistor is coupled to the first electrode of the fourth transistor and the second power supply line, the second electrode of the fifth transistor is coupled to the first electrode of the third transistor, the second electrode of the fourth transistor and the charging component, the control electrode of the fifth transistor is coupled to the control electrode of the third transistor and the output terminal of the second NOR gate.

In some implementations, the second NOR gate includes a sixth transistor and a seventh transistor which have the second switching characteristic and an eighth transistor and a ninth transistor which have the first switching characteristic, control electrodes of the sixth transistor and the eighth transistor are used as the first input terminal of the second NOR gate, control electrodes of the seventh transistor and the ninth transistor are used as the second input terminal of the second NOR gate, a first electrode of the seventh transistor, second electrodes of the eighth transistor and the ninth transistor are used as the output terminal of the second NOR gate, a first electrode of the sixth transistor is coupled to a second electrode of the seventh transistor, a second electrode of the sixth transistor is coupled to the first power supply line, the control electrode of the sixth transistor is coupled to the control electrode of the eighth transistor and the output terminal of the first NOR gate, the first electrode of the seventh transistor is coupled to the second electrodes of the eighth transistor and the ninth transistor, the second electrode of the seventh transistor is coupled to the first electrode of the sixth transistor, the control electrode of the seventh transistor is coupled to the control electrode of the ninth transistor and the reset signal terminal, a first electrode of the eighth transistor is coupled to a first electrode of the ninth transistor and the second power supply line, the second electrode of the eighth transistor is coupled to the first electrode of the seventh transistor and the second electrode of the ninth transistor, the control electrode of the eighth transistor is coupled to the control electrode of the sixth transistor and the output terminal of the first NOR gate, the first electrode of the ninth transistor is coupled to the first electrode of the eighth transistor and the second power supply line, the second electrode of the ninth transistor is coupled to the first electrode of the seventh transistor, the second electrode of the eighth transistor and the charging component, the control electrode of the ninth transistor is coupled to the control electrode of the seventh transistor and the reset signal terminal.

In some implementations, the charging component includes a tenth transistor and an eleventh transistor which have a first switching characteristic, a first electrode of the tenth transistor is coupled to a second signal line, a second electrode of the tenth transistor is coupled to the display component and a second electrode of the eleventh transistor, a control electrode of the tenth transistor is coupled to the latch component, a first electrode of the eleventh transistor is coupled to a first signal line, the second electrode of the eleventh transistor is coupled to the display component and the second electrode of the tenth transistor, and a control electrode of the eleventh transistor is coupled to the latch component.

An embodiment of the present disclosure provides a pixel circuit, including a switch component, a latch component and a charging component, the switch component includes a first transistor having a first switching characteristic, the latch component includes a second transistor and a third transistor which have a second switching characteristic, a fourth transistor and a fifth transistor which have the first switching characteristic, a sixth transistor and a seventh transistor which have the second switching characteristic, and an eighth transistor and a ninth transistor which have the first switching characteristic, the charging component includes a tenth transistor and an eleventh transistor which have the first switching characteristic, a first electrode of the first transistor is coupled to a data line, a second electrode of the first transistor is coupled to a control electrode of the second transistor, a control electrode of the first transistor is coupled to a scan line, a first electrode of the second transistor is coupled to a second electrode of the third transistor, a second electrode of the second transistor is coupled to a first power supply line, the control electrode of the second transistor is coupled to the second electrode of the first transistor and a control electrode of the fourth transistor, a first electrode of the third transistor is coupled to second electrodes of the fourth transistor and the fifth transistor, the second electrode of the third transistor is coupled to the first electrode of the second transistor, a control electrode of the third transistor is coupled to a control electrode of the fifth transistor and a control electrode of the tenth transistor, a first electrode of the fourth transistor is coupled to a first electrode of the fifth transistor and a second power supply line, the second electrode of the fourth transistor is coupled to the first electrode of the third transistor and the second electrode of the fifth transistor, the control electrode of the fourth transistor is coupled to the second electrode of the first transistor and the control electrode of the second transistor, the first electrode of the fifth transistor is coupled to the first electrode of the fourth transistor and the second power supply line, the second electrode of the fifth transistor is coupled to the first electrode of the third transistor, the second electrode of the fourth transistor and a control electrode of the eleventh transistor, the control electrode of the fifth transistor is coupled to the control electrode of the third transistor and the control electrode of the tenth transistor, a first electrode of the sixth transistor is coupled to a second electrode of the seventh transistor, a second electrode of the sixth transistor is coupled to the first power supply line, a control electrode of the sixth transistor is coupled to a control electrode of the eighth transistor and the second electrode of the fifth transistor, a first electrode of the seventh transistor is coupled to second electrodes of the eighth transistor and the ninth transistor, the second electrode of the seventh transistor is coupled to the first electrode of the sixth transistor, a control electrode of the seventh transistor is coupled to a control electrode of the ninth transistor and a reset signal terminal, a first electrode of the eighth transistor is coupled to a first electrode of the ninth transistor and the second power supply line, the second electrode of the eighth transistor is coupled to the first electrode of the seventh transistor and the second electrode of the ninth transistor, the control electrode of the eighth transistor is coupled to the control electrode of the sixth transistor, the first electrode of the ninth transistor is coupled to the first electrode of the eighth transistor and the second power supply line, the second electrode of the ninth transistor is coupled to the first electrode of the seventh transistor, the second electrode of the eighth transistor and the control electrode of the tenth transistor, the control electrode of the ninth transistor is coupled to the control electrode of the seventh transistor and the reset signal terminal, a first electrode of the tenth transistor is coupled to a second signal line, a second electrode of the tenth transistor is coupled to the display component and a second electrode of the eleventh transistor, the control electrode of the tenth transistor is coupled to the control electrode of the third transistor and the second electrode of the ninth transistor, a first electrode of the eleventh transistor is coupled to a first signal line, the second electrode of the eleventh transistor is coupled to the display component and the second electrode of the tenth transistor, the control electrode of the eleventh transistor is coupled to the first electrode of the third transistor, and the second electrodes of the fourth transistor and the fifth transistor.

An embodiment of the present disclosure provides a method for driving the pixel circuit described above, including: a reset stage, during which the reset signal is a working level signal, and the scanning signal is a non-working level signal, the switch component is turned off, the latch component is turned on and outputs the first control signal, the charging component is turned on under control of the first control signal, a first signal is written into the display component through the charging component to reset the display component.

In some implementations, the method further includes: a display stage including a first gray scale displaying and/or a second gray scale displaying, during the first gray scale displaying, the scanning signal is the working level signal, the switch component is turned on, the data voltage signal is at a low level, the latch component outputs the first control signal to control the charging component to be turned on, the first signal is written into the display component through the charging component so that the display component displays the first gray scale, and during the second gray scale displaying, the scanning signal is the working level signal, the switch component is turned on, the data voltage signal is at a high level, the latch component outputs the second control signal to control the charging component to be turned on, the second signal is written into the display component through the charging component so that the display component displays the second gray scale.

An embodiment of the present disclosure further provides a display panel including the pixel circuit described above.

An embodiment of the present disclosure further provides a display device including the display panel described above.

DESCRIPTION OF EMBODIMENTS

In order to make a person skilled in the art understand technical solutions of the present disclosure better, the technical solutions of the present disclosure will be described in detail below in conjunction with accompanying drawings and specific embodiments.

Transistors employed by the embodiments of the present disclosure may be thin film transistors, field effect transistors or other similar elements, and a source and a drain of each transistor are exchangeable under a certain condition. For convenience of distinguishing and description, one of the source and the drain of each transistor is referred to as a first electrode, and the other of the source and the drain of each transistor is referred to as a second electrode, and a gate of each transistor is referred to as a control electrode. In addition, according to characteristics of the transistors, the transistors may be divided into N-type transistors and P-type transistors. The embodiments of the present disclosure are described by taking a first transistor, a fourth transistor, a fifth transistor, an eighth transistor, a ninth transistor, a tenth transistor and an eleventh transistor being N-type transistors, and a second transistor, a third transistor, a sixth transistor and a seventh transistor are P-type transistors as an example. The first electrode of the P-type transistor is the source, the second electrode of the P-type transistor is the drain, and when a low level is input to the gate of the P-type transistor, the source and the drain of the P-type transistor are conducted electrically. The first electrode of the N-type transistor is the source, the second electrode of the N-type transistor is the drain, and when a high level signal is input to the gate of the N-type transistor, the source and the drain of the N-type transistor is conducted electrically. In the embodiments of the present disclosure, the N-type transistors have a first switching characteristic, and the P-type transistors have a second switching characteristic. Certainly, based on descriptions of the embodiments of the present disclosure, it is conceivable for persons skilled in the art to make the first transistor, the fourth transistor, the fifth transistor, the eighth transistor, the ninth transistor, the tenth transistor and the eleventh transistor be P-type transistors, and the second transistor, the third transistor, the sixth transistor and the seventh transistor be N-type transistors, such implementation should also be considered to be within the protection scope of the present disclosure.

The embodiments of the present disclosure are described by further taking a gray scale of L0 (black) as a first gray scale and a gray scale of L255 (white) as a second gray scale as an example. It should be understood that, as long as the first gray scale and the second gray scale are different from each other, the first gray scale is not limited to black and the second gray scale is not limited to white.

Figure 1:
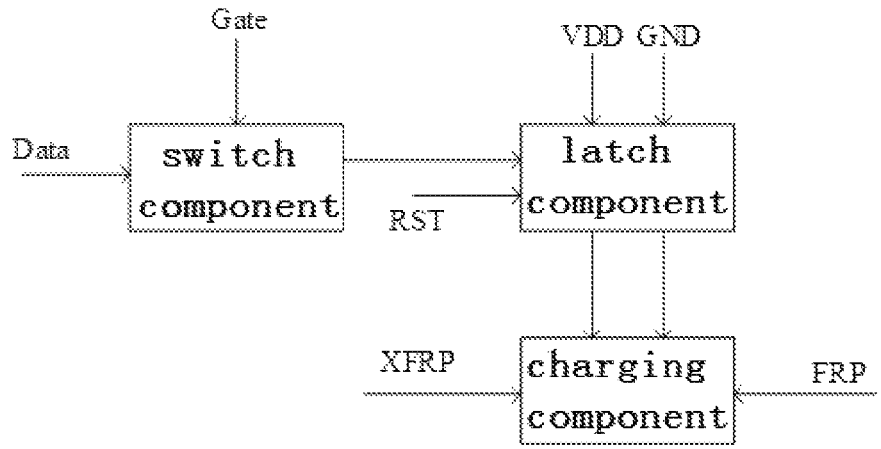
FIG. 1 shows a schematic block diagram of a pixel circuit in accordance with an embodiment of the present disclosure.

FIG. 1 shows a schematic block diagram of a pixel circuit in accordance with an embodiment of the present disclosure. The pixel circuit is mainly applied in a wearable device such as a watch. Each pixel element of the pixel circuit is mainly used for displaying gray scales of L0 and L255, that is, pixel elements of the pixel circuit are used for displaying two gray scales. As shown in FIG. 1, the pixel circuit of the embodiment includes a switch component, a latch component and a charging component. The switch component is configured to output a data voltage signal to the latch component under control of a scanning signal. The latch component is configured to output a first control signal under control of a reset signal in a case where the switch component is turned off, so that the charging component is turned on, and output the first control signal or a second control signal to the charging component according to the data voltage signal in a case where the switch component is turned on, and the first control signal and the second control signal have polarities opposite to each other. The charging component is configured to write a first signal to a display component in the case where the switch component is turned off, so as to reset the display component, and in the case where the switch component is turned on, write the first signal to the display component under control of the first control signal so as to control the display component to display the gray scale of L0, and write a second signal to the display component under control of the second control signal so as to control the display component to display the gray scale of L255.

In the pixel circuit of the embodiment, the latch component outputs the first control signal under control of the reset signal in the case where the switch component is turned off, so that the charging component is turned on, and the first signal is written into the display component to reset the display component, and outputs the first control signal or the second control signal to the charging component according to the data voltage signal in the case where the switch component is turned on, the charging component writes the first signal into the display component under control of the first control signal and writes the second signal into the display component under control of the second control signal, so as to control the display component to display the gray scales of L0 and L255 respectively, that is, the latch component of the pixel circuit of the embodiment is used for not only a display function but also a reset function, so that the pixel circuit has a simple structure and a universal applicability.

Figure 2:
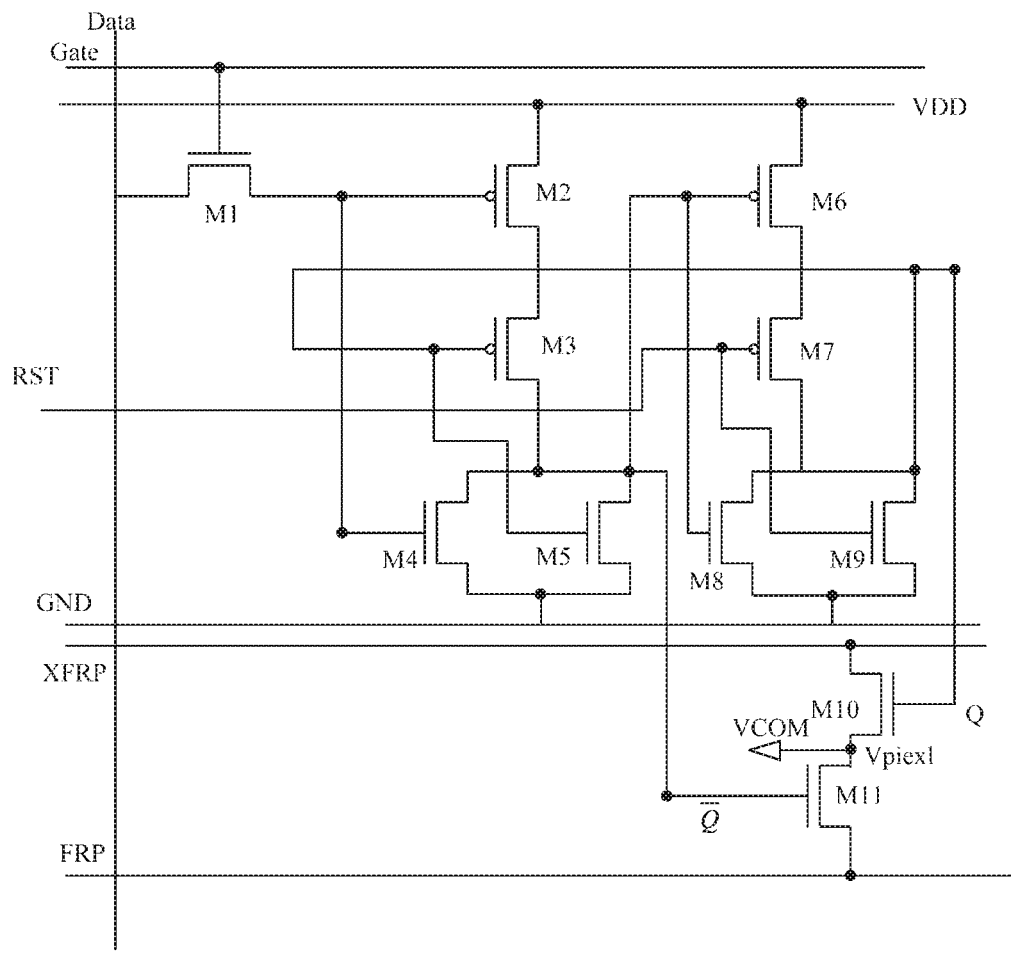
FIG. 2 shows a circuit diagram of a pixel circuit in accordance with an embodiment of the present disclosure.

FIG. 2 shows a circuit diagram of a pixel circuit in accordance with an embodiment of the present disclosure. As shown in FIG. 2, in the pixel circuit of the embodiment, the switch component includes a first transistor M1 which is an N-type transistor, a first electrode of the first transistor M1 is coupled to a data line Data, a second electrode of the first transistor M1 is coupled to the latch component, and a control electrode of the first transistor M1 is coupled to a scan line Gate. That is, when a high level signal is input to the scan line Gate, the first transistor M1 is turned on, thus the data voltage signal of the data line Date is written into the latch component and latched. The latch component includes a first NOR gate and a second NOR gate. A first input terminal of the first NOR gate is coupled to the switch component, a second input terminal of the first NOR gate is coupled to an output terminal of the second NOR gate and the charging component, an output terminal of the first NOR gate is coupled to a first input terminal of the second NOR gate and the charging component. The first input terminal of the second NOR gate is coupled to the output terminal of the first NOR gate and the charging component, a second input terminal of the second NOR gate is coupled to a reset signal terminal RST, and the output terminal of the second NOR gate is coupled to the second input terminal of the first NOR gate and the charging component.

In some implementations, the first NOR gate includes a second transistor M2, a third transistor M3, a fourth transistor M4 and a fifth transistor M5. The second transistor M2 and the third transistor M3 are P-type transistors. The fourth transistor M4 and the fifth transistor M5 are N-type transistors. Control electrodes of the second transistor M2 and the fourth transistor M4 are used as the first input terminal of the first NOR gate, and control electrodes of the third transistor M3 and the fifth transistor M5 are used as the second input terminal of the first NOR gate. A first electrode of the second transistor M2 is coupled to a second electrode of the third transistor M3, a second electrode of the second transistor M2 is coupled to a first power supply line VDD, and the control electrode of the second transistor M2 is coupled to the switch component and the control electrode of the fourth transistor M4. A first electrode of the third transistor M3 is coupled to second electrodes of the fourth transistor M4 and the fifth transistor M5, the second electrode of the third transistor M3 is coupled to the first electrode of the second transistor M2, and the control electrode of the third transistor M3 is coupled to the control electrode of the fifth transistor M5 and the output terminal of the second NOR gate. A first electrode of the fourth transistor M4 is coupled to a first electrode of the fifth transistor M5 and a second power supply line GND, the second electrode of the fourth transistor M4 is coupled to the first electrode of the third transistor M3 and the second electrode of the fifth transistor M5, and the control electrode of the fourth transistor M4 is coupled to the switch component and the control electrode of the second transistor M2. The first electrode of the fifth transistor M5 is coupled to the first electrode of the fourth transistor M4 and the second power supply line GND, the second electrode of the fifth transistor M5 is coupled to the first electrode of the third transistor M3, the second electrode of the fourth transistor M4 and the charging component, and the control electrode of the fifth transistor M5 is coupled to the control electrode of the third transistor M3 and the output terminal of the second NOR gate. The first electrode of the third transistor M3 and the second electrodes of the fourth transistor M4 and the fifth transistor M5 are used as the output terminal of the first NOR gate.

In some implementations, the second NOR gate includes a sixth transistor M6, a seventh transistor M7, an eighth transistor M8 and a ninth transistor M9. The sixth transistor M6 and the seventh transistor M7 are P-type transistors, and the eighth transistor M8 and the ninth transistor M9 are N-type transistors. Control electrodes of the sixth transistor M6 and the eighth transistor M8 are used as the first input terminal of the second NOR gate, and control electrodes of the seventh transistor M7 and the ninth transistor M9 are used as the second input terminal of the second NOR gate. A first electrode of the sixth transistor M6 is coupled to a second electrode of the seventh transistor M7, a second electrode of the sixth transistor M6 is coupled to the first power supply line VDD, and the control electrode of the sixth transistor M6 is coupled to the control electrode of the eighth transistor M8 and the output terminal of the first NOR gate. A first electrode of the seventh transistor M7 is coupled to second electrodes of the eighth transistor M8 and the ninth transistor M9, the second electrode of the seventh transistor M7 is coupled to the first electrode of the sixth transistor M6, and the control electrode of the seventh transistor M7 is coupled to the control electrode of the ninth transistor M9 and the reset signal terminal RST. A first electrode of the eighth transistor M8 is coupled to a first electrode of the ninth transistor M9 and the second power supply line GND, the second electrode of the eighth transistor M8 is coupled to the first electrode of the seventh transistor M7 and the second electrode of the ninth transistor M9, and the control electrode of the eighth transistor M8 is coupled to the control electrode of the sixth transistor M6 and the output terminal of the first NOR gate. The first electrode of the ninth transistor M9 is coupled to the first electrode of the eighth transistor M8 and the second power supply line GND, the second electrode of the ninth transistor M9 is coupled to the first electrode of the seventh transistor M7, the second electrode of the eighth transistor M8 and the charging component, and the control electrode of the ninth transistor M9 is coupled to the control electrode of the seventh transistor M7 and the reset signal terminal RST. The first electrode of the seventh transistor M7, the second electrodes of the eighth transistor M8 and the ninth transistor M9 are used as the output terminal of the second NOR gate.

Since the second transistor M2 and the third transistor M3 are P-type transistors, and the fourth transistor M4 and the fifth transistor M5 are N-type transistors, while the sixth transistor M6 and the seventh transistor M7 are P-type transistors, and the eighth transistor M8 and the ninth transistor M9 are N-type transistors, when the high level signal is input to the scan line Gate, the switch component is turned on, and the data voltage signal of the data line Date is at a high level, the fourth transistor M4 is turned on, the third transistor M3 is turned off, the first NOR gate outputs a low level signal, and then the sixth transistor M6 and the seventh transistor M7 are turned on, the second NOR gate outputs a high level signal, the charging component is turned on, and the second signal of the second signal line XFRP is output to the display component for displaying the gray scale of L255. When a high level signal is input to the scan line Gate, the switch component is turned on and the data voltage signal of the data line Date is at a low level, the second transistor M2 is turned on, the fourth transistor M4 is turned off, and the output of the first NOR gate cannot be grounded, and since the latch component has a static storage function, the output of the second NOR gate is still maintained at the low level, the third transistor M3 is turned on, the fifth transistor M5 is turned off, thereby the output of the first NOR gate becomes at the high level, the charging component is turned on, and the first signal of the first signal line FRP is written into the display component for displaying the gray scale of L0.

The charging component includes a tenth transistor M10 and an eleventh transistor M11. Both the tenth transistor M10 and the eleventh transistor M11 are N-type transistors. A first electrode of the tenth transistor M10 is coupled to the second signal line XFRP, a second electrode of the tenth transistor M10 is coupled to the display component and a second electrode of the eleventh transistor M11, and a control electrode of the tenth transistor M10 is coupled to the latch component. A first electrode of the eleventh transistor M111 is coupled to the first signal line FRP, the second electrode of the eleventh transistor M11 is coupled to the display component and the second electrode of the tenth transistor M10, and a control electrode of the eleventh transistor M11 is coupled to the latch component.

In the embodiment, when the output of the first NOR gate is at the high level, the eleventh transistor M11 is turned on, the display component is charged by the first signal through the charging component for displaying the gray scale of L0, and when the output of the second NOR gate is at the high level, the tenth transistor M10 is turned on, the display component is charged by the second signal through the charging component for displaying the gray scale of L255.

The pixel circuit of the embodiment includes the switch component, the latch component and the charging component, the switch component includes the first transistor M1 of N-type, the latch component includes a second transistor M2 and a third transistor M3 which are P-type transistors, a fourth transistor M4 and a fifth transistor M5 which are N-type transistors, a sixth transistor M6 and a seventh transistor M7 which are P-type transistors, and an eighth transistor M8 and a ninth transistor M9 which are N-type transistors, the charging component includes a tenth transistor M10 and an eleventh transistor M11 which are N-type transistors. In some implementations, the first electrode of the first transistor M1 is coupled to the data line Data, the second electrode of the first transistor M1 is coupled to the control electrode of the second transistor M2, the control electrode of the first transistor M1 is coupled to the scan line Gate; the first electrode of the second transistor M2 is coupled to the second electrode of the third transistor M3, the second electrode of the second transistor M2 is coupled to the first power supply line VDD, the control electrode of the second transistor M2 is coupled to the second electrode of the first transistor M1 and the control electrode of the fourth transistor M4; the first electrode of the third transistor M3 is coupled to the second electrodes of the fourth transistor M4 and the fifth transistor M5, the second electrode of the third transistor M3 is coupled to the first electrode of the second transistor M2, the control electrode of the third transistor M3 is coupled to the control electrode of the fifth transistor M5 and the control electrode of the tenth transistor M10; the first electrode of the fourth transistor M4 is coupled to the first electrode of the fifth transistor M5 and the second power supply line GND, the second electrode of the fourth transistor M4 is coupled to the first electrode of the third transistor M3 and the second electrode of the fifth transistor M5, the control electrode of the fourth transistor M4 is coupled to the second electrode of the first transistor M1 and the control electrode of the second transistor M2; the first electrode of the fifth transistor M5 is coupled to the first electrode of the fourth transistor M4 and the second power supply line GND, the second electrode of the fifth transistor M5 is coupled to the first electrode of the third transistor M3, the second electrode of the fourth transistor M4 and the control electrode of the eleventh transistor M11, the control electrode of the fifth transistor M5 is coupled to the control electrode of the third transistor M3 and the control electrode of the tenth transistor M10; the first electrode of the sixth transistor M6 is coupled to the second electrode of the seventh transistor M7, the second electrode of the sixth transistor M6 is coupled to the first power supply line VDD, the control electrode of the sixth transistor M6 is coupled to the control electrode of the eighth transistor M8 and the second electrode of the fifth transistor M5; the first electrode of the seventh transistor M7 is coupled to the second electrodes of the eighth transistor M8 and the ninth transistor M9, the second electrode of the seventh transistor M7 is coupled to the first electrode of the sixth transistor M6, the control electrode of the seventh transistor M7 is coupled to the control electrode of the ninth transistor M9 and the reset signal terminal RST; the first electrode of the eighth transistor M8 is coupled to the first electrode of the ninth transistor M9 and the second power supply line GND, the second electrode of the eighth transistor M8 is coupled to the first electrode of the seventh transistor M7 and the second electrode of the ninth transistor M9, the control electrode of the eighth transistor M8 is coupled to the control electrode of the sixth transistor M6; the first electrode of the ninth transistor M9 is coupled to the first electrode of the eighth transistor M8 and the second power supply line GND, the second electrode of the ninth transistor M9 is coupled to the first electrode of the seventh transistor 7, the second electrode of the eighth transistor M8 and the control electrode of the tenth transistor M10, the control electrode of the ninth transistor M9 is coupled to the control electrode of the seventh transistor M7 and the reset signal terminal RST; the first electrode of the tenth transistor M10 is coupled to the second signal line XFRP, the second electrode of the tenth transistor M10 is coupled to the display component and the second electrode of the eleventh transistor MI 1, the control electrode of the tenth transistor M10 is coupled to the control electrode of the third transistor M3 and the second electrode of the ninth transistor M9; the first electrode of the eleventh transistor M11 is coupled to the first signal line FRP, the second electrode of the eleventh transistor M1 is coupled to the display component and the second electrode of the tenth transistor M10, the control electrode of the eleventh transistor M11 is coupled to the first electrode of the third transistor M3, and the second electrodes of the fourth transistor M4 and the fifth transistor M5.

A method for driving the pixel circuit described above will be illustrated below. The method of the embodiment includes a reset stage and a display stage. The gray scales of L0 and L255 may be displayed during the display stage. Certainly, only one of the gray scales L0 and L255 may be displayed.

During the reset stage, the reset signal is a working level signal, and the scanning signal is a non-working level signal, the switch component is turned off, the latch component is turned on and outputs the first control signal, the charging component is turned on under control of the first control signal, a first signal is written into the display component through the charging component to reset the display component.

During the display stage, in a case where the gray scale of L255 is to be displayed, the scanning signal is the working level signal, the switch component is turned on, the data voltage signal is at a high level, the latch component outputs the second control signal to control the charging component to be turned on, the second signal is written into the display component through the charging component so that the display component displays the gray scale of L255.

During the display stage, in a case where the gray scale of L0 is to be displayed, the scanning signal is the working level signal, the switch component is turned on, the data voltage signal is at a low level, the latch component outputs the first control signal to control the charging component to be turned on, the first signal is written into the display component through the charging component so that the display component displays the gray scale of L0.

The reset stage, a period of the display stage for displaying the gray scale of L255, and a period of the display stage for displaying the gray scale of L0 will be illustrated below in conjunction with FIGS. 3 and 4.

Figure 3:
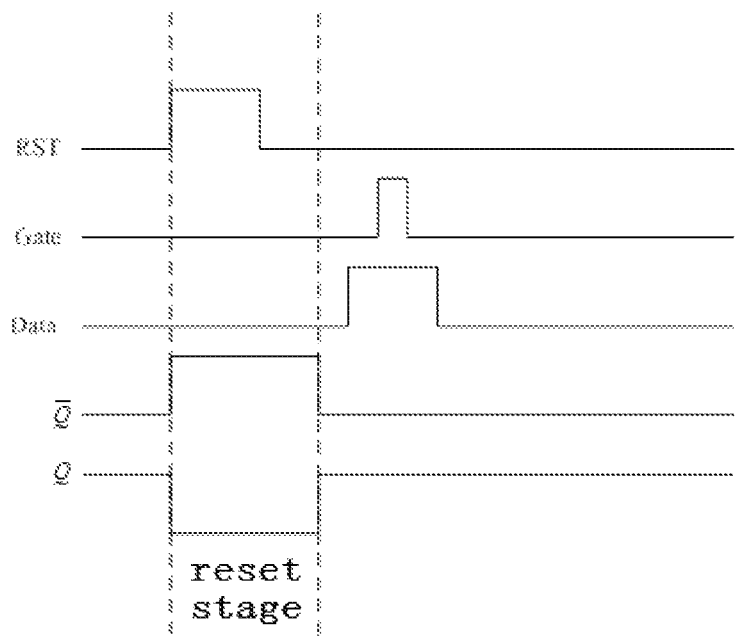
FIG. 3 shows a timing diagram of signals during a reset stage of a method for driving a pixel circuit in accordance with an embodiment of the present disclosure.
Figure 4:
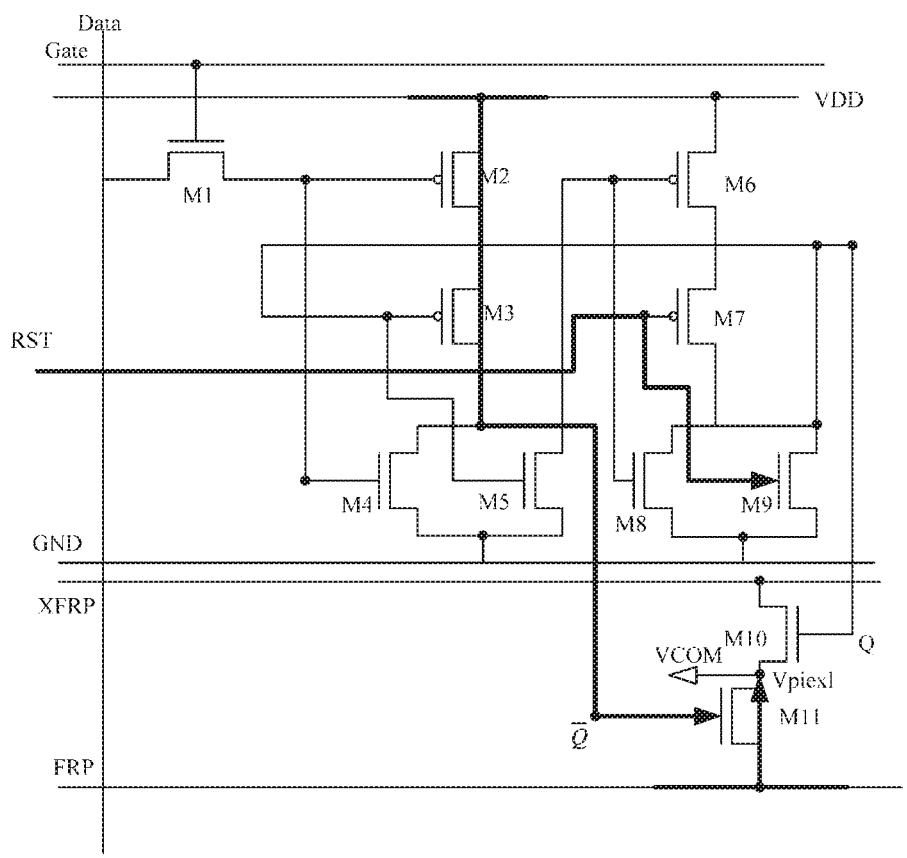
FIG. 4 shows a schematic diagram of current flow of a pixel circuit during a reset stage in accordance with an embodiment of the present disclosure.

During the reset stage, as shown in FIGS. 3 and 4, there is no signal on the scan line Gate and the data line Data, the first transistor M1 is turned off, a high level signal is input to the reset signal terminal RST, so that the ninth transistor M9 is turned on, the seventh transistor M7 is turned off, the output Q of the second NOR gate in the latch component becomes at a low level, then the second transistor M2 and the third transistor M3 are turned on (the second transistor M2 is turned on due to a low level signal as an original signal applied to the control electrode of the second transistor M2), the output Q of the first NOR gate in the latch component becomes at a high level, and then the eleventh transistor M11 is turned on, the tenth transistor M10 is turned off, the display component displays the gray scale of L0, that is, a reset function is achieved, with such reset function, when the display component displays a picture in error, the display component can be reset to display the gray scale of L0.

The reset stage may begin upon display of a frame of picture is completed, or upon a picture is displayed in error. Certainly, the reset stage may also begin when the display component switches between the gray scale of L0 and the gray scale of L255.

However, it should be understood that, since the reset stage is achieved by the display component displaying the gray scale of L0, reset is not required when the display component switches between the gray scale of L0 and the gray scale of L255, but the reset may be performed when the display component switches between another two gray scales different from each other.

Figure 5:
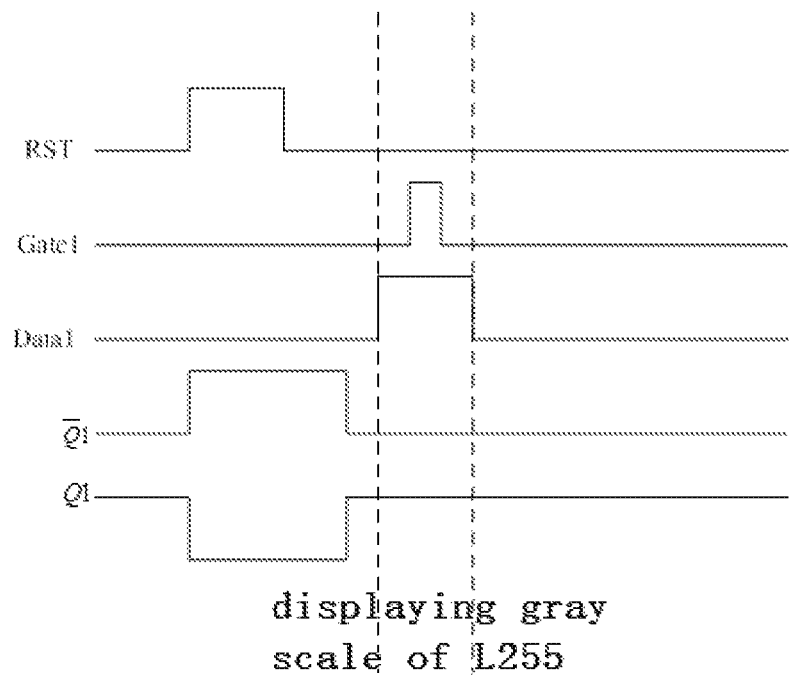
FIG. 5 shows a timing diagram of signals, for displaying a gray scale of L255, of a method for driving a pixel circuit in accordance with an embodiment of the present disclosure.
Figure 6:
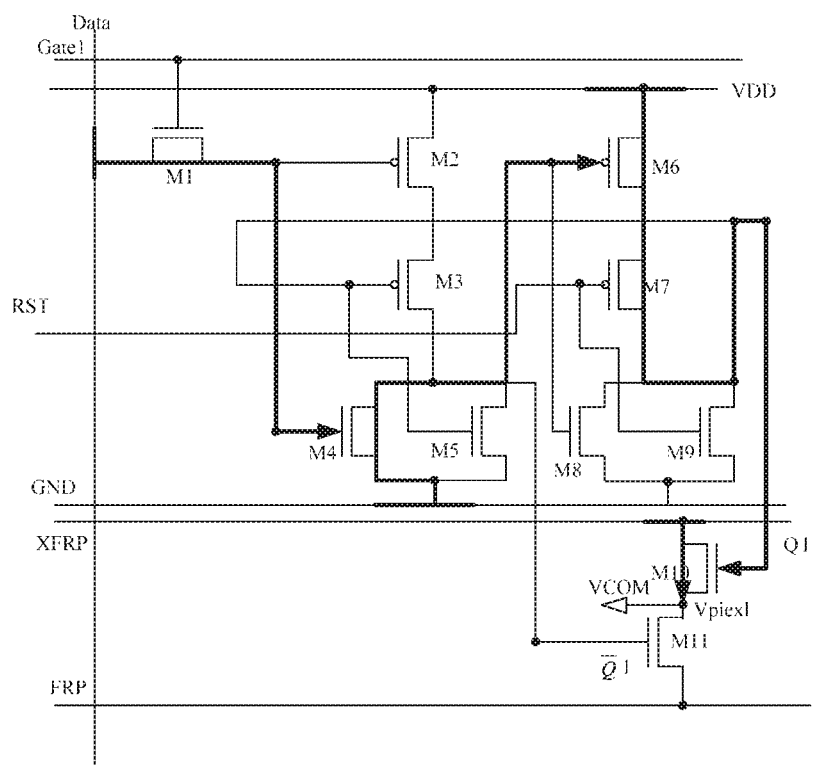
FIG. 6 shows a schematic diagram of current flow, for displaying a gray scale of L255, of a pixel circuit in accordance with an embodiment of the present disclosure.
Figure 9:
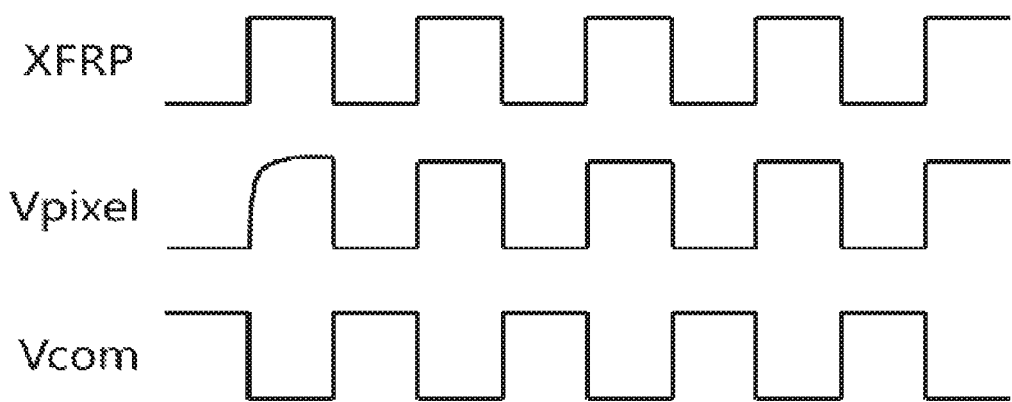
FIG. 9 shows a timing diagram of signals, for displaying a gray scale of L255, of a method for driving a pixel circuit in accordance with an embodiment of the present disclosure.

During the display stage, in a case where the gray scale of L255 is to be displayed, as shown in FIGS. 5 and 6, when a high level signal is input to the scan line Gate1 and the data voltage signal of the data line Data1 is also at a high level, the fourth transistor M4 is turned on, the third transistor M3 is turned off, the output $\overline{Q1}$ of the first NOR gate in the latch component becomes at a low level, the sixth transistor M6 and the seventh transistor M7 are turned on, so that the output Q1 of the second NOR gate in the latch component becomes at a high level, the tenth transistor M10 is turned on, the eleventh transistor M11 is turned off, as shown in FIG. 9, the second signal of the second signal line XFRP is output to a pixel electrode Vpixel of the display component, so that the pixel electrode Vpixel is at a signal level opposite to that of a common electrode Vcom, thus the display component displays the gray scale of L255, thereby a corresponding pixel row of the display component is transformed from a reset state to a state of displaying the gray scale of L255.

Figure 7:
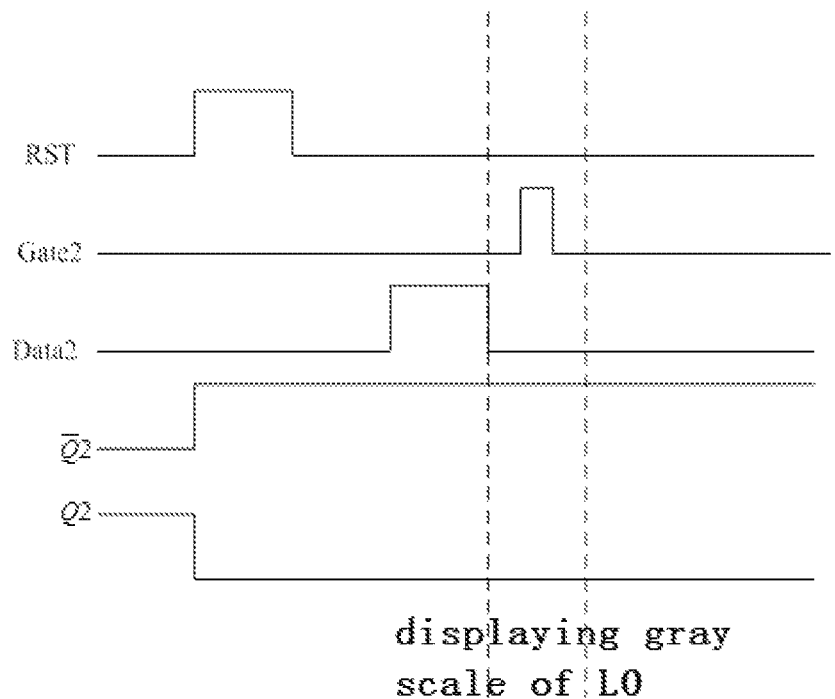
FIG. 7 shows a timing diagram of signals, for displaying a gray scale of L0, of a method for driving a pixel circuit in accordance with an embodiment of the present disclosure.
Figure 8:
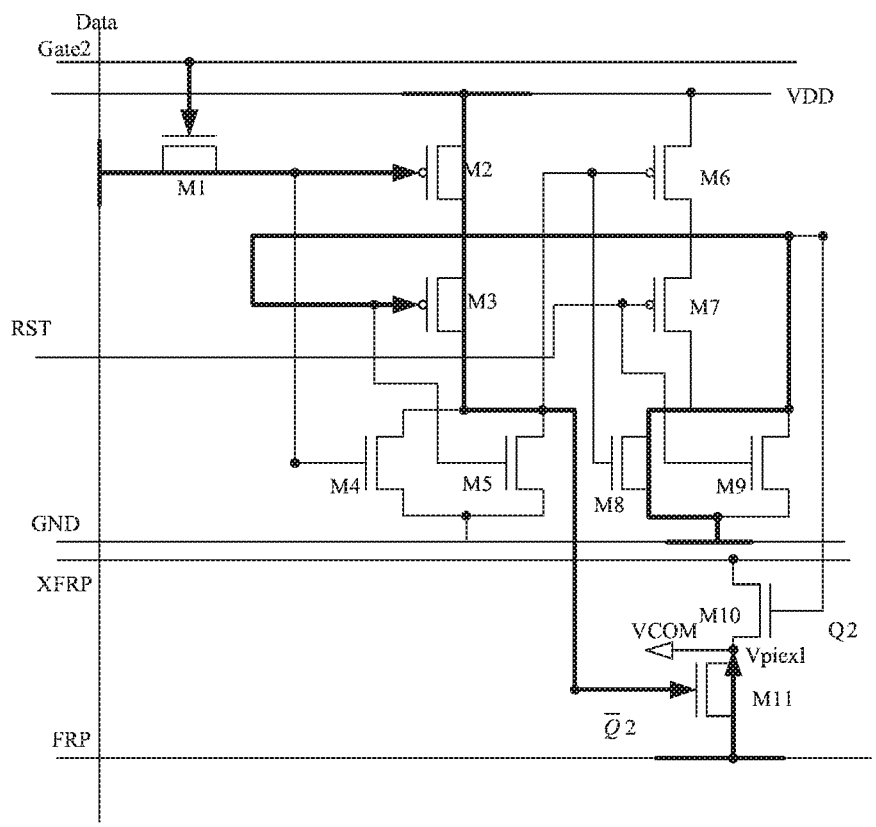
FIG. 8 shows a schematic diagram of current flow, for displaying a gray scale of L0, of a pixel circuit in accordance with an embodiment of the present disclosure.
Figure 10:
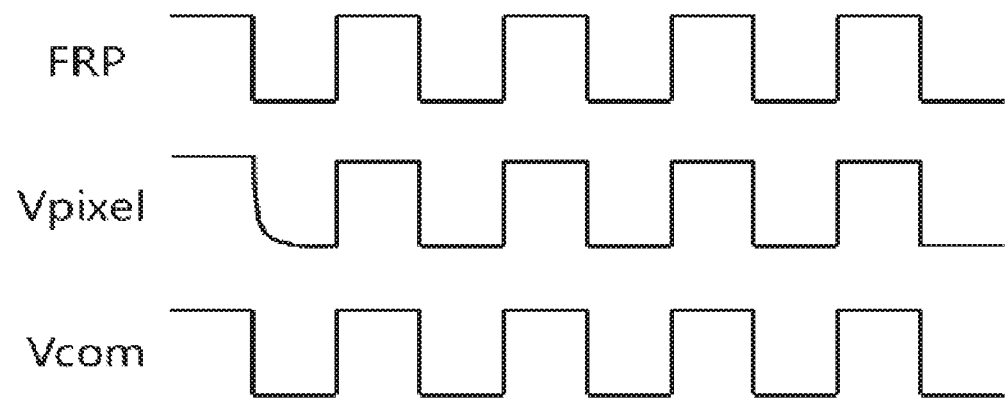
FIG. 10 shows a timing diagram of signals, for displaying a gray scale of L0, of a method for driving a pixel circuit in accordance with an embodiment of the present disclosure.

During the display stage, in a case where the gray scale of L0 is to be displayed, as shown in FIGS. 7 and 8, when a high level signal is input to the scan line Gate2 and the signal of the data line Data2 is at a low level, the second transistor is turned on, the fourth transistor M4 is turned off, the output $\overline{Q2}$ of the first NOR gate in the latch component cannot be electrically conducted to the second power supply line GND, that is, cannot be grounded, and since the latch component has a static storage function, the output Q2 is maintained at the low level, the third transistor M3 is turned on, the fifth transistor M5 is turned off, the output $\overline{Q2}$ of the first NOR gate in the latch component is electrically conducted to the first power supply line VDD, that is, electrically conducted to the power supply voltage VDD, thus becomes at a high level, the eleventh transistor M11 is turned on, the tenth transistor M10 is turned off, as shown in FIG. 10, the first signal of the first signal line FRP is output to the pixel electrode Vpixel of the display component, so that the pixel electrode Vpixel is at a signal level the same as that of the common electrode Vcom, thus the display component displays the gray scale of L0, thereby the corresponding pixel row of the display component is maintained at the reset state for displaying the gray scale of L0.

It should be noted that, the order for displaying the gray scales of L255 and L0 is not limited in practical applications, the gray scales of L255 and L0 are only two display states of the pixel circuit, the scan lines Gate, Gate1 and Gate2 only indicate that signals loaded thereon are different from each other, and the data lines Data, Data1 and Data2 also only indicate that signals loaded thereon are different from each other.

An embodiment of the present disclosure also provides a display panel including the pixel circuit of the embodiment described above.

An embodiment of the present disclosure also provides a display device including a display panel of the embodiment described above. The display device of the embodiment may be a wearable device such as a watch.

The display device of the embodiment may be a liquid crystal display device or an electroluminescent display device, such as liquid crystal display, electronic paper, OLED) display, mobile phone, tablet computer, television, notebook computer, digital photo frame, navigator, or any product or member having a display function.

It should be understood that, the above embodiments are merely exemplary embodiments for explaining principle of the present disclosure, but the present disclosure is not limited thereto. Various modifications and improvements may be made by those ordinary skilled in the art within the spirit and essence of the present disclosure, these modifications and improvements fall into the protection scope of the present disclosure.

The invention claimed is:

1. A pixel circuit, comprising a switch component, a latch component and a charging component, wherein
the switch component is configured to output a data voltage signal to the latch component under control of a scanning signal;
the latch component is configured to output a first control signal under control of a reset signal in a case where the switch component is turned off, so that the charging component is turned on, and output the first control signal or a second control signal to the charging component according to the data voltage signal in a case where the switch component is turned on; and
the charging component is configured to write a first signal to a display component in the case where the switch component is turned off, so as to reset the display component, and in the case where the switch component is turned on, write the first signal to the display component under control of the first control signal so as to control the display component to display a first gray scale, and write a second signal to the display component under control of the second control signal so as to control the display component to display a second gray scale.

2. The pixel circuit of claim 1, wherein the switch component comprises a first transistor having a first switching characteristic, a first electrode of the first transistor is coupled to a data line, a second electrode of the first transistor is coupled to the latch component, and a control electrode of the first transistor is coupled to a scan line.

3. The pixel circuit of claim 1, wherein the latch component comprises a first NOR gate and a second NOR gate,
a first input terminal of the first NOR gate is coupled to the switch component, a second input terminal of the first NOR gate is coupled to an output terminal of the second NOR gate and the charging component, an output terminal of the first NOR gate is coupled to a first input terminal of the second NOR gate and the charging component,
the first input terminal of the second NOR gate is coupled to the output terminal of the first NOR gate and the charging component, a second input terminal of the second NOR gate is coupled to a reset signal terminal, and the output terminal of the second NOR gate is coupled to the second input terminal of the first NOR gate and the charging component.

4. The pixel circuit of claim 3, wherein the first NOR gate comprises a second transistor and a third transistor which have a second switching characteristic and a fourth transistor and a fifth transistor which have the first switching characteristic,
control electrodes of the second transistor and the fourth transistor are used as the first input terminal of the first NOR gate, control electrodes of the third transistor and the fifth transistor are used as the second input terminal of the first NOR gate, a first electrode of the third transistor and second electrodes of the fourth transistor and the fifth transistor are used as the output terminal of the first NOR gate,
a first electrode of the second transistor is coupled to a second electrode of the third transistor, a second electrode of the second transistor is coupled to a first power supply line, the control electrode of the second transistor is coupled to the switch component and the control electrode of the fourth transistor,
the first electrode of the third transistor is coupled to the second electrodes of the fourth transistor and the fifth transistor, the second electrode of the third transistor is coupled to the first electrode of the second transistor, the control electrode of the third transistor is coupled to the control electrode of the fifth transistor and the output terminal of the second NOR gate,
a first electrode of the fourth transistor is coupled to a first electrode of the fifth transistor and a second power supply line, the second electrode of the fourth transistor is coupled to the first electrode of the third transistor and the second electrode of the fifth transistor, the control electrode of the fourth transistor is coupled to the switch component and the control electrode of the second transistor,
the first electrode of the fifth transistor is coupled to the first electrode of the fourth transistor and the second power supply line, the second electrode of the fifth transistor is coupled to the first electrode of the third transistor, the second electrode of the fourth transistor and the charging component, the control electrode of the fifth transistor is coupled to the control electrode of the third transistor and the output terminal of the second NOR gate.

5. The pixel circuit of claim 3, wherein the second NOR gate comprises a sixth transistor and a seventh transistor which have the second switching characteristic and an eighth transistor and a ninth transistor which have the first switching characteristic,
control electrodes of the sixth transistor and the eighth transistor are used as the first input terminal of the second NOR gate, control electrodes of the seventh transistor and the ninth transistor are used as the second input terminal of the second NOR gate, a first electrode of the seventh transistor, second electrodes of the eighth transistor and the ninth transistor are used as the output terminal of the second NOR gate,
a first electrode of the sixth transistor is coupled to a second electrode of the seventh transistor, a second electrode of the sixth transistor is coupled to the first power supply line, the control electrode of the sixth transistor is coupled to the control electrode of the eighth transistor and the output terminal of the first NOR gate,
the first electrode of the seventh transistor is coupled to the second electrodes of the eighth transistor and the ninth transistor, the second electrode of the seventh transistor is coupled to the first electrode of the sixth transistor, the control electrode of the seventh transistor is coupled to the control electrode of the ninth transistor and the reset signal terminal,
a first electrode of the eighth transistor is coupled to a first electrode of the ninth transistor and the second power supply line, the second electrode of the eighth transistor is coupled to the first electrode of the seventh transistor and the second electrode of the ninth transistor, the control electrode of the eighth transistor is coupled to the control electrode of the sixth transistor and the output terminal of the first NOR gate,
the first electrode of the ninth transistor is coupled to the first electrode of the eighth transistor and the second power supply line, the second electrode of the ninth transistor is coupled to the first electrode of the seventh transistor, the second electrode of the eighth transistor and the charging component, the control electrode of the ninth transistor is coupled to the control electrode of the seventh transistor and the reset signal terminal.

6. The pixel circuit of claim 1, wherein the charging component comprises a tenth transistor and an eleventh transistor which have a first switching characteristic,
a first electrode of the tenth transistor is coupled to a second signal line, a second electrode of the tenth transistor is coupled to the display component and a second electrode of the eleventh transistor, a control electrode of the tenth transistor is coupled to the latch component,
a first electrode of the eleventh transistor is coupled to a first signal line, the second electrode of the eleventh transistor is coupled to the display component and the second electrode of the tenth transistor, and a control electrode of the eleventh transistor is coupled to the latch component.

7. A pixel circuit, comprising a switch component, a latch component and a charging component, wherein
the switch component comprises a first transistor having a first switching characteristic, the latch component comprises a second transistor and a third transistor which have a second switching characteristic, a fourth transistor and a fifth transistor which have the first switching characteristic, a sixth transistor and a seventh transistor which have the second switching characteristic, and an eighth transistor and a ninth transistor which have the first switching characteristic, the charging component comprises a tenth transistor and an eleventh transistor which have the first switching characteristic,
a first electrode of the first transistor is coupled to a data line, a second electrode of the first transistor is coupled to a control electrode of the second transistor, a control electrode of the first transistor is coupled to a scan line,
a first electrode of the second transistor is coupled to a second electrode of the third transistor, a second electrode of the second transistor is coupled to a first power supply line, the control electrode of the second transistor is coupled to the second electrode of the first transistor and a control electrode of the fourth transistor,
a first electrode of the third transistor is coupled to second electrodes of the fourth transistor and the fifth transistor, the second electrode of the third transistor is coupled to the first electrode of the second transistor, a control electrode of the third transistor is coupled to a control electrode of the fifth transistor and a control electrode of the tenth transistor,
a first electrode of the fourth transistor is coupled to a first electrode of the fifth transistor and a second power supply line, the second electrode of the fourth transistor is coupled to the first electrode of the third transistor and the second electrode of the fifth transistor, the control electrode of the fourth transistor is coupled to the second electrode of the first transistor and the control electrode of the second transistor,
the first electrode of the fifth transistor is coupled to the first electrode of the fourth transistor and the second power supply line, the second electrode of the fifth transistor is coupled to the first electrode of the third transistor, the second electrode of the fourth transistor and a control electrode of the eleventh transistor, the control electrode of the fifth transistor is coupled to the control electrode of the third transistor and the control electrode of the tenth transistor,
a first electrode of the sixth transistor is coupled to a second electrode of the seventh transistor, a second electrode of the sixth transistor is coupled to the first power supply line, a control electrode of the sixth transistor is coupled to a control electrode of the eighth transistor and the second electrode of the fifth transistor,
a first electrode of the seventh transistor is coupled to second electrodes of the eighth transistor and the ninth transistor, the second electrode of the seventh transistor is coupled to the first electrode of the sixth transistor, a control electrode of the seventh transistor is coupled to a control electrode of the ninth transistor and a reset signal terminal,
a first electrode of the eighth transistor is coupled to a first electrode of the ninth transistor and the second power supply line, the second electrode of the eighth transistor is coupled to the first electrode of the seventh transistor and the second electrode of the ninth transistor, the control electrode of the eighth transistor is coupled to the control electrode of the sixth transistor,
the first electrode of the ninth transistor is coupled to the first electrode of the eighth transistor and the second power supply line, the second electrode of the ninth transistor is coupled to the first electrode of the seventh transistor, the second electrode of the eighth transistor and the control electrode of the tenth transistor, the control electrode of the ninth transistor is coupled to the control electrode of the seventh transistor and the reset signal terminal,
a first electrode of the tenth transistor is coupled to a second signal line, a second electrode of the tenth transistor is coupled to the display component and a second electrode of the eleventh transistor, the control electrode of the tenth transistor is coupled to the control electrode of the third transistor and the second electrode of the ninth transistor,
a first electrode of the eleventh transistor is coupled to a first signal line, the second electrode of the eleventh transistor is coupled to the display component and the second electrode of the tenth transistor, the control electrode of the eleventh transistor is coupled to the first electrode of the third transistor, and the second electrodes of the fourth transistor and the fifth transistor.

8. A method for driving the pixel circuit of claim 1, comprising:
a reset stage, during which the reset signal is a working level signal, and the scanning signal is a non-working level signal, the switch component is turned off, the latch component is turned on and outputs the first control signal, the charging component is turned on under control of the first control signal, a first signal is written into the display component through the charging component to reset the display component.

9. The method of claim 8, further comprising: a display stage comprising a first gray scale displaying period and/or a second gray scale displaying period,
during the first gray scale displaying period, the scanning signal is the working level signal, the switch component is turned on, the data voltage signal is at a low level, the latch component outputs the first control signal to control the charging component to be turned on, the first signal is written into the display component through the charging component so that the display component displays the first gray scale, and
during the second gray scale displaying period, the scanning signal is the working level signal, the switch component is turned on, the data voltage signal is at a high level, the latch component outputs the second control signal to control the charging component to be turned on, the second signal is written into the display component through the charging component so that the display component displays the second gray scale.

10. A display panel, comprising the pixel circuit of claim 1.

11. A display device, comprising the display panel of claim 10.

* * * * *